(12) United States Patent
Thomas et al.

(10) Patent No.: US 8,034,412 B2
(45) Date of Patent: Oct. 11, 2011

(54) TREATMENT OF ITEMS

(75) Inventors: David Stephen Thomas, Cambridge (GB); Philip Gareth Bentley, Cambridge (GB)

(73) Assignee: Conductive Inkjet Technology Limited, Ossett (GB)

( * ) Notice: Subject to any disclaimer, the term of this patent is extended or adjusted under 35 U.S.C. 154(b) by 649 days.

(21) Appl. No.: 11/886,835

(22) PCT Filed: Mar. 21, 2006

(86) PCT No.: PCT/GB2006/001008
§ 371 (c)(1),
(2), (4) Date: Oct. 31, 2008

(87) PCT Pub. No.: WO2006/100460
PCT Pub. Date: Sep. 28, 2006

(65) Prior Publication Data
US 2009/0202783 A1    Aug. 13, 2009

(30) Foreign Application Priority Data
Mar. 22, 2005    (GB) .................................. 0505824.3

(51) Int. Cl.
*B05D 5/00*    (2006.01)
*H05K 13/00*    (2006.01)
*H01L 21/00*    (2006.01)

(52) U.S. Cl. ........ 427/256; 427/284; 427/314; 438/118; 438/121; 29/841; 29/855

(58) Field of Classification Search .................... 428/60, 428/61, 157, 172, 192, 256, 284; 427/256, 427/284, 314; 438/118, 121, 125; 29/841, 29/855
See application file for complete search history.

(56) References Cited

U.S. PATENT DOCUMENTS

| | | | |
|---|---|---|---|
| 5,062,567 A | 11/1991 | Nishihara et al. | |
| 5,496,769 A | 3/1996 | Marion et al. | |
| 5,677,246 A * | 10/1997 | Maeta et al. | 438/118 |
| 6,395,124 B1 | 5/2002 | Oxman et al. | |
| 2004/0037514 A1* | 2/2004 | Marion et al. | 385/90 |

OTHER PUBLICATIONS

WO 2005/044451, May 2005.*

* cited by examiner

*Primary Examiner* — Donald J Loney
(74) *Attorney, Agent, or Firm* — Morgan Lewis & Bockius LLP

(57) ABSTRACT

A method of forming a ramp of material on a stepped portion of an item, comprises applying material in liquid form to the item in the vicinity of the stepped portion, the liquid having properties such that the liquid moves by capillary attraction to the stepped portion, and causing or allowing the material to solidify to form a ramp on the stepped portion. By using capillary flow, it is not necessary for the material to be placed in position very accurately. Variations in position of placement can be accommodated by the flow to the stepped region. The greater tolerance in accuracy of positioning means that processing can be performed more quickly.

10 Claims, 2 Drawing Sheets

TREATMENT OF ITEMS

FIELD OF THE INVENTION

This invention relates to treatment of items, and concerns a method of forming a ramp of material on a stepped portion of an item. A stepped portion of an item means a portion with angled topography, typically having a right angle or other steep angle (possibly a reentrant angle). An example of a situation where this arises is a component located on a planar region of a substrate so that the component protrudes from the substrate, e.g. an electronic component such as a microchip on a substrate in the form of a printed circuit board.

BACKGROUND OF THE INVENTION

The invention involves addition of material to a surface to ease the topography and provide ramps and chamfered edges to features that originally have steep, vertical or undercut faces. For example, surface mount electronic components placed on a printed circuit board may have facet heights of several hundred microns or more and these facets would usually present themselves as vertical walls substantially at 90 degrees to the plane of the board. Many techniques exist which apply coatings by depositing liquids from above the substrate; these include liquid dispensing, spray coating and inkjet printing. In such a situation, these techniques would have great difficulty in reliably coating the vertical wall of such a component in order to provide a continuous coating across the board and whole component.

Our co-pending International Patent Application No. PCT/GB2004/004595 (WO 2005/044451) describes the deposition of an adhesive substance around a silicon chip in order to overcome a vertical edge and allow a second material to be inkjet printed continuously from the substrate up to a contact pad located on the top surface of the silicon chip. WO 2005/044451 gives the example of using a high speed glue dispenser to dispense drops of adhesive on either side of the chip in order to build up a ramp of material.

Although this is an adequate solution it requires a degree of control and accuracy which would render it a relatively slow step in a continuous production process.

SUMMARY OF THE INVENTION

According to the present invention there is provided a method of forming a ramp of material on a stepped portion of an item, comprising applying material in liquid form to the item in the vicinity of the stepped portion, the liquid having properties such that the liquid moves by capillary attraction to the stepped portion, and causing or allowing the material to solidify to form a ramp on the stepped portion.

The material may be applied by any convenient technique, including dropping, spraying, printing etc. Automated or semi-automated equipment is conveniently used, e.g. mechanical or pneumatic liquid dispenser systems, including mechanical syringes, continuous or drop-on-demand inkjet printers, automated micro-pipettes, etc.

The material may solidify by drying or curing (thermally, chemically, on exposure to radiation e.g. ultra violet, infra red, etc), with conditions being adjusted appropriately. The material may be, e.g., an adhesive material.

By using capillary flow, it is not necessary for the material to be placed in position very accurately: variations in position of placement can be accommodated by the flow to the stepped region. The greater tolerance in accuracy of positioning means that processing can be performed more quickly, which is of great advantage in automated mass production of items such as electronic circuits.

The method conveniently constitutes one step in a multi-step production process.

The invention finds particular application in the production of electronic components, as a preparatory step before forming electronically conductive connections e.g. between a component such as a microchip and a substrate such as a printed circuit board, e.g. as disclosed in WO 2005/044451.

To be capable of capillary flow, the liquid should have a low viscosity, i.e. less than 100 cps, preferably less than 50 cps, and more preferably less than 20 cps (in all cases at 25° C).

The liquid should be selected having regard to the surface properties of the material of the step base (e.g. substrate) and step side (e.g. component). The liquid should have good wetting to the step base material, i.e. forming a contact angle of less than 45°, possibly less than 30°. The liquid should have at least reasonable wetting to the step side material, i.e. forming a contact angle of 90° or less.

The material preferably exhibits low shrinkage on solidification. The amount of shrinkage that can be tolerated depends on the elasticity of the material. Typically it is preferred that shrinkage is less than 20%.

The material is preferably flexible and non-brittle for robustness in use, although in some applications and for some substrates (e.g. fragile substrates such as glass) such considerations are not of particular relevance.

The liquid conveniently comprises one or more monomers and/or oligomers which can polymerise and/or cross-link in use, thereby forming a solid. Suitable materials are well known to those skilled in the art. For example, UV curable materials include acrylates and methacrylates.

The ramp may extend part way up the step, to form a chamfer, or to the top of the step (and possibly beyond).

The ramp surface may be generally planar, concave or convex, with convex ramps being preferred.

The step base (e.g. substrate) and step side (e.g. component) may be of the same material or different material.

The invention thus makes use of materials which then allow the natural physical forces of capillary action, wetting and dewetting to be exploited in order to self assemble such a ramp without the need for accurately depositing materials with respect to the position of the chip, as in WO 2005/044451.

This has the great advantage that in a production process both the chip and the material could be deposited with relatively low accuracy making the assembly process faster and cheaper.

As well as allowing more reliable coating of such parts the current invention also provides other enhancements to manufacturing processes. WO 2005/044451 gives examples of providing conducting contact to silicon chips. In many cases these devices will be die-level chips which have been cut from a large wafer. In the course of manufacturing such devices many layers of conducting and semiconducting materials are built up on the wafer. When the wafer is then cut into individual dies, these layers may be exposed at the cleaved edge of the die. The application of a conducting material directly onto the edge of the die could give rise to a short circuit between such layers and render the device inoperable. In a number of cases, the application of such a layer to the device would be intended to allow connection to a bond pad situated on the top surface of the chip. The current invention also includes means for preventing any insulating adhesive or filler layer from covering the bond pads and preventing electrical contact.

The invention has particular application in the preparation of artefacts to allow optimised printing and coating onto items which exhibit significant topography. In particular the invention enables the preparation of surfaces to remove shear edges and steep angles that can cause problems in printing and coating processes. In a particular embodiment the invention is applied to providing a ramp to allow the printing of a continuous area of material from a substrate onto a silicon chip which has been placed on said substrate. This is especially important if said area of material is to form an electrically conductive link between said chip and another component or system. The invention applies particularly to performing such operations in a mass production environment.

The invention also includes within its scope an item having a ramp formed thereon by the method of the invention. The ramp is commonly used as a base on which further material is deposited subsequently.

The invention will be further described, by way of illustration, in the following Examples and with reference to the accompanying Figures, in which:

FIGS. 1a, 1b and 1c illustrate schematically material deposited at or near the junction of a silicon chip mounted on a substrate;

FIG. 2 is a photograph of a cross-section of a ramp formed by the method of the invention between a polyester substrate and a microchip glued thereon (with the microchip removed to permit formation of a cross-section); and FIG. 3 is a schematic illustration of a silicon chip with bumped gold contact pads mounted on a polyester substrate, with a ramp formed thereon by the method of the invention.

Figure 1A:
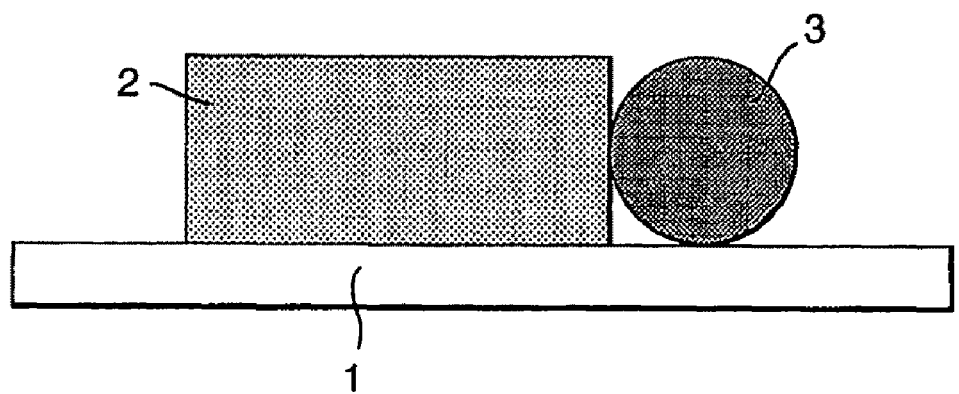
FIGS. 1a, 1b and 1c show a polyester substrate 1 with a microchip 2 mounted thereon.

A ramp may be formed up to the substantially vertical side wall of the chip by applying an adhesive or filler material near the edge of the ramp. The profile of the ramp formed will depend on the viscosity of the material, its surface energy (wetting) with respect to the substrate and the chip (as represented by the contact angle) and also the time required for the material to harden or cure. A high viscosity material, cured quickly (with respect to the time taken for the material to flow naturally) or a material that does not easily wet the substrate, may form a ramp 3 as shown in FIG. 1a, with a contact angle of greater than 90 degrees with the substrate.

Figure 1B:
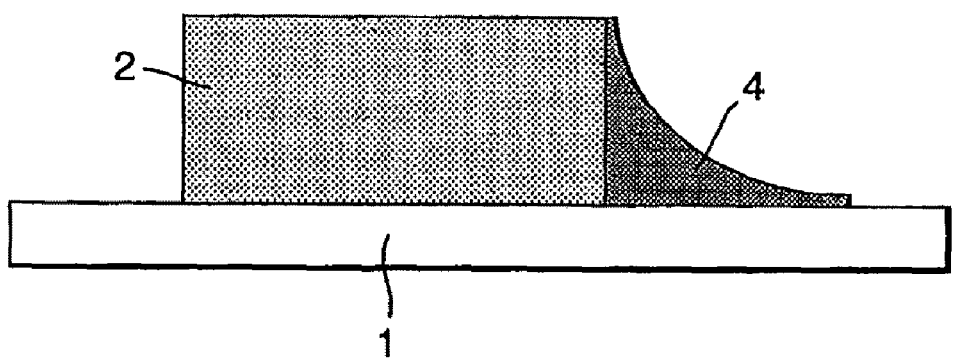
Figure 1C:
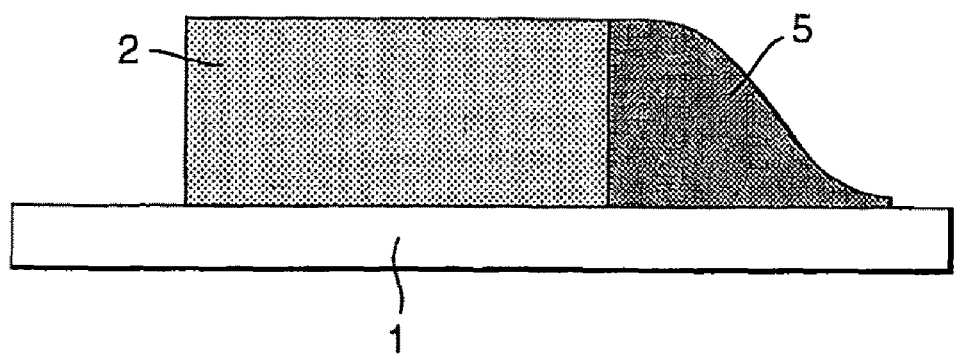

A low viscosity material which may flow before it is hardened and which also has good wetting on the substrate and chip will form a contact angle which is less than 90 degrees to the substrate and or chip. FIG. 1b shows a concave ramp 4 formed by material which has good wetting to both the chip and the substrate. In this case surface tension dominates and produces a ramp profile which has a shallow angle with respect to both substrate and chip. FIG. 1c shows a convex ramp 5 formed by material which has good wetting to the substrate but intermediate wetting to the chip so that the contact angle with the chip is somewhat larger. Ramps of the form shown in FIGS. 1b and 1c are both acceptable in the present invention, with convex ramps of the form shown in FIG. 1c being preferred.

In order to provide a ramp, the material may be carefully applied around the chip. This would usually be a slow process requiring a high degree of accuracy. An alternative approach is to use a low viscosity material with appropriate surface energy for good wetting and apply an excess of this material near the chip such that it forms a small pool which then impinges on the edge of the chip. Because of the good wetting and the low viscosity the material will then tend to wick around the chip wetting its edges and the substrate. If sufficient material is put down then the chip may be completely surrounded merely by depositing a single pool of adhesive near one edge of the chip.

The material may be applied by hand, using an hypodermic syringe and needle or pipette or may be applied in a more controlled manor using automated or semi automated equipment. Such equipment could include, but is not limited to, mechanical or pneumatic liquid dispenser systems (e.g. by EFD or I&J Fisnar Inc.), continuous or drop-on-demand ink-jet printers, automated micro-pipettes or Surface mount technology glue dispensers.

In a production environment where higher precision may involve reduced process speed, the sample positioning system and liquid dispensing system may be configured such that the relative position of the chip with respect to the deposition system is only required to be within a relatively coarse range. For example a system may be configured such that the material is deposited with the edge of the chip to be no less than 10 microns from the deposition nozzle and no more than 2 mm away from it. This kind of range would be a very easy tolerance for modern production equipment such as automated liquid deposition system produced by I&J Fisnar Inc. of New Jersey, USA. This technique is also mostly insensitive to the angular orientation of the chip with respect to the liquid dispensing system.

EXAMPLE 1

Rectangular Chip

Figure 2:
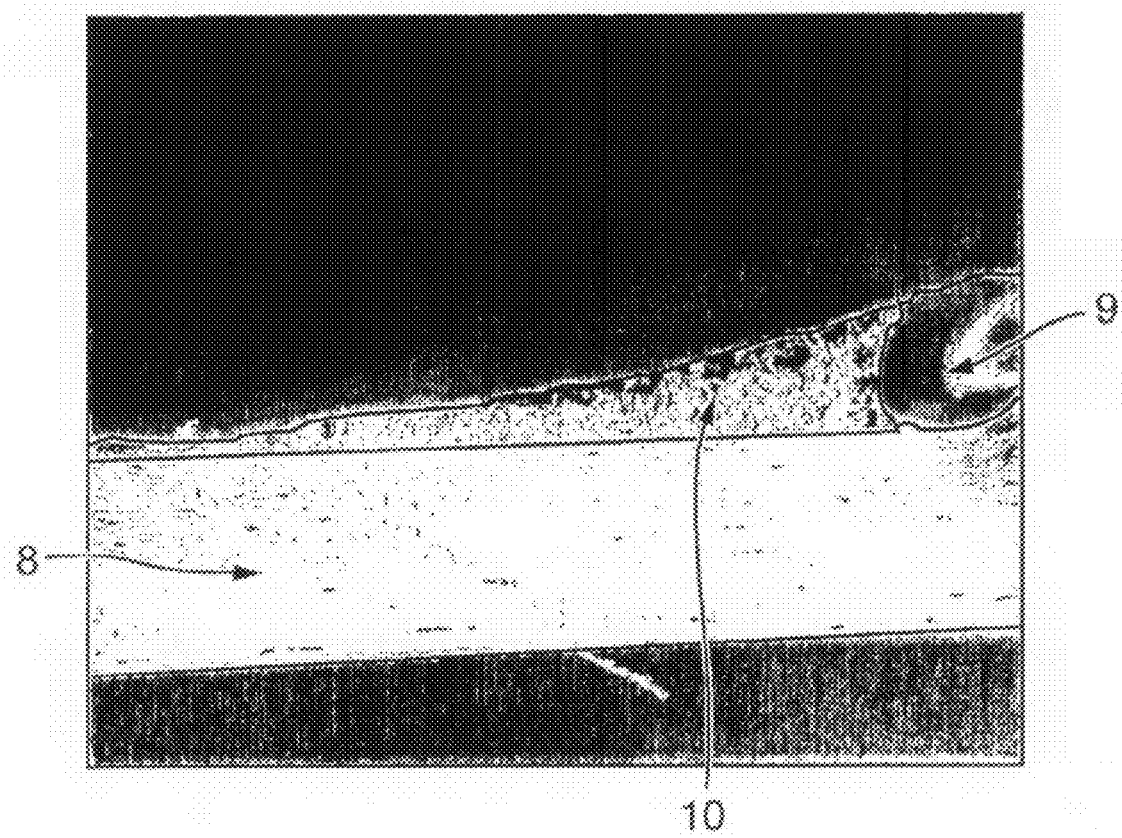

Referring to FIG. 2, a 200 micron thick silicon chip was received bonded to a polyester substrate using a thermally cured epoxy resin which formed a bond of around 1 micron thickness between the chip and the substrate and did not exceed the area of the chip. In order to form a ramp up to the chip a UV curable adhesive (Fluid 1 below) with low viscosity (<20 cps at 25° C.), good wetting to polyester and acceptable wetting to silicon was deposited approximately 1.5 mm away from the chip using a liquid dispenser system from I&J Fisnar Inc. Sufficient material was deposited for the pool of liquid to impinge on the edge of the chip so that wicking occurred and drew the liquid around the edge of the chip, forming a ramp of the form shown in FIG. 1b. The adhesive was then cured by exposing it to UV light from a Fusion Systems Light Hammer 6 microwave UV lamp.

| Material | Fluid 1 |
| --- | --- |
| Irgacure 1700 | 3.3 |
| Irgacure 819 | 1.3 |
| Diacetone alcohol | 48.5 |
| PVP K 30 | 2.6 |
| Dipentaerythritol hexaacrylate | 3 |
| Actilane 505 | 10.2 |
| Dipropyleneglycol diacrylate | 31.1 |

Igracure 1700 and Igracure 819 are UV photo-initiators supplied by Ciba Speciality Chemicals, Macclesfield, UK—Irgacure is a Trade Mark. PVP K30 is a grade of polyvinyl pyrrolidinone supplied by ISP, Tadworth, UK. Dipentaerythritol hexaacrylate (DPHA) is a UV-curable hexafunctional monomer supplied by UCB, Dragenbos, Belgium. Actilane 505 is a UV-curable reactive tetrafunctional polyester acrylate oligomer supplied by Akzo Nobel UV Resins, Manchester, UK. Dipropylene glycol diacrylat (DPGDA) is a UV-curable reactive diluent monomer supplied by UCB, Dragenbos, Belgium. The monomers and oligomers are in liquid form.

PVP constitutes a water soluble chemical functionality. The monomers and oligomers, Actilane 505, DPHA and DPGDA, react to form a polymer that constitutes a water insoluble chemical functionality.

Although this formulation worked well, upon subsequent processing the bond between the adhesive and the chip failed in a number of cases. This failure was attributed to the relatively low flexibility and high shrinkage upon curing that this material exhibits.

An improved formulation with lower shrinkage and higher flexibility was produced (Fluid 2 below). This gave better results without the debonding at the chip edge found with Fluid 1.

| Material | Fluid 2 |
|---|---|
| Irgacure 1700 | 5 |
| BYK-333 | 0.3 |
| CN982A75 | 24.7 |
| IBOA | 55 |
| SR285 | 15 |

Iragacure is a free radical photoinitiator manufactured by CIBA and is a blend of bis (2,6-dimethoxybenzoyl)-2,4,4-trimethyl pentylphosphineoxide and of 2-hydroxy-2-methyl-1-phenyl-propane-1-one. BYK-333 is polyether modified poly-dimethyl-polysiloxane, from BYK Chemie GmbH. CN 982A75 is aliphatic polyester/polyether based urethane diacrylate oligomer blended with 25% tripropylene glycol diacrylate, from Sartomer. IBOA is isoboryl acrylate, from Sartomer or UCB. SR 285 is tetrahydrofurfuryl acrylate, from Sartomer. The viscosity of Fluid 2 is 16.4 cps at 25° C.

Both Fluid 1 and Fluid 2 have good wetting to the polyester substrate, forming a contact angle of less than 45°, and reasonable wetting to the side of the chip, forming a contact angle of 90° or less.

EXAMPLE 2

Undercut Chip

This technique was found to be highly applicable in the case of chips where the edges are under-cut i.e. the bottom face of the chip is smaller than the top face causing the edge of the chip to overhang the substrate. A similar procedure to that in Example 1 was employed to provide a ramp up to a Nanoblock chip (Nanoblock is a Trade Mark), made by Alien Technologies, which has its edges modified to give an undercut. This process used Fluid 2 as an adhesive and again cured using UV light. In this case the capillary forces wicked the fluid under the edge of the chip and allowed the material to form a ramp rather than an undercut. It was found that the ramp could be further enhanced by repeating the process several times.

EXAMPLE 3

Undercut Glue Bond

In instances where chips were bonded to substrates using viscous epoxy resin a bead of glue may be forced out from under the chip. In some cases this bead my have also cause an overhang above the substrate. FIG. 2 shows a substrate 8 on which a chip (not shown) has been secured in position by glue 9. Attempting to inkjet print a thin coating over such an overhang will often result in a discontinuity caused by the inability of the printed coating to bridge the gap caused by the overhang. In some cases it is possible to print multiple layers such that the ink will fill the gap but this will often result in wicking of the ink around the overhang and in the case of printing conducting layers this will result in short circuits.

The methodology presented in Example 2 was extended to the case of overhanging glue bonds. Fluid 2 was deposited using a pneumatic liquid dispense system from I&J Fisnar. The fluid was deposited approximately 2 mm away from the edge of the existing glue bond and allowed to form a pool which impinged upon the glue bond. Capillary forces drew the adhesive under the glue bond and surrounded the whole chip. The fluid was then cured as described in example 1. FIG. 2 show a cross section of the glue bond 9 and the adhesive ramp 10 formed. The chip has been removed from this sample to allow cross-sectioning.

EXAMPLE 4

Dewetting Away from Bond Pads

In cases where wetting of the silicon chip is good and a significant ramp is required a problem which often occurs is that the adhesive impinges on the top surface of the chip and wets out across that surface. This is most problematic if there are contact pads on the top surface of the chip which will require electrical connection. If the adhesive coats these pads then it may prevent later electrical connections from being made. A solution to this is to alter the surface energy of the bond pads such that the adhesive applied naturally dewets from the pads. In cases where this treatment has been applied, the accuracy needed for the adhesive deposition is further reduced by making it possible to deposit the adhesive directly on top of the chip without insulating the bond pads. Many techniques are known for modifying surface energy including plasma etching, corona treatment and the application of self assembled monolayers. These techniques may be applied selectively either by depositing the material in a selective manner e.g. by inkjet printing, deposition through a shadow mask, microcontact printing etc. or may exploit the surface chemistry of the situation to allow the treatment to happen selectively.

Figure 3:
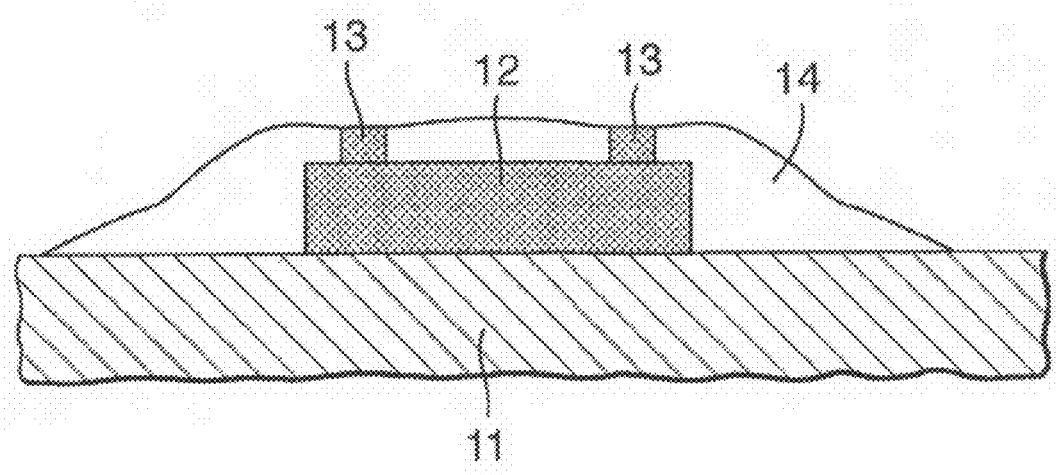

Referring to FIG. 3, silicon chips 12 with gold contact pads 13 were bonded to polyester substrates 11 using a thermally cured epoxy resin. The chips were 200 microns in thickness and presented a substantially vertical sidewall to the substrate. The surfaces of the chips were treated with dodecane thiol by covering the chip with the liquid and heating at 50° C. on a hotplate for 5 minutes. The excess was then pipetted off and the chip was then washed with ethanol and dried. Many other alkyl thiols or indeed other sulphur containing organic compounds may be used in place of dodecane thiol. The interaction of the thiol group with the surface of the gold-bumped bond pads causes the dodecane thiol to form a self assembled monolayer only on the gold pads. This renders the contact pads highly hydrophobic and provides poor wetting for the adhesive fluid 2.

In one example, excess adhesive is deposited near the chip such that it was able to flow over the top surface. The adhesive was observed to wet the chip around the contact pads but left them clear. The adhesive was then cured as described in Example 1. The process employed in WO 2005/044451 was then used to print a catalytic layer up to the contact pads. This layer also tended to dewet from the pads but formed a continuous catalyst layer from the substrate up to the very edge of the pad. The whole device was then immersed in an electroless plating solution as per WO 2005/044451 which grew copper metal on both the catalyst and the bond pads. The catalyst layer made sufficient contact with the bond pad for the copper layer to form a continuous conductive track from the substrate up to and across the bond pad.

In a second example, the adhesive Fluid 2 was deposited directly on top of the dodecane thiol treated silicon chip, in sufficient quantity that it covered the chip and flowed over the edges of the chip and formed an even ramp 14 around the whole structure, as shown in FIG. 3. This deposition was performed manually using an I&J Fisnar fluid dispenser. The adhesive was not able to wet the gold contact pads and left them uncoated while completely encapsulating the whole of the rest of the chip. Again, the process employed in WO 2005/044451 was used to produce continuous conductive tracks from the substrate onto the contact pads.

In a third example, a similarly treated chip was overcoated with adhesive Fluid 2 by inkjet printing a 10 mm wide swathe of the fluid using a Xaar XJ 128-200 printhead, printing at a down-web resolution of 1000 dpi. Again the sample was cured by passing it under a Fusion Systems Light Hammer 6 microwave UV lamp. It was found that this process could be repeated several times, building up a thicker layer, before the material would start to wet onto the gold contact pads.

Again, continuous conductive copper tracks were formed from the substrate up to the bond pads using the process described in WO 2005/044451.

The invention claimed is:

1. A method of forming a ramp of material on a stepped portion of an item, comprising
    applying material in liquid form to the item in the vicinity of the stepped portion, the liquid having properties such that the liquid moves by capillary attraction to the stepped portion;
    causing or allowing the material to solidify to form a ramp on the stepped portion
    forming an electrically conductive connection or track on the ramp; and
    treating of one or more contact pads on the item with an alkyl thiol prior to application of the material.

2. A method according to claim 1, wherein material is applied by dropping, spraying or printing.

3. A method according to claim 1 or 2, wherein the material solidifies by drying on curing.

4. A method according to claim 1 or 2, wherein the liquid has a viscosity of less than 100 cps, preferably less than 50 cps, and more preferably less than 20 cps.

5. A method according to claim 1, wherein the liquid forms a contact angle of less than 45° with the step base material.

6. A method according to claim 1, wherein the liquid forms a contact angle of 90° or less with the step side material.

7. A method according to claim 1, wherein the material exhibits low shrinkage on solidification.

8. A method according to claim 5, wherein the liquid forms a contact angle of less than 30° with the step base material.

9. A method according to claim 1, wherein the alkyl thiol comprises dodecane thiol.

10. A method according to claim 1, wherein the treating comprises heat treatment.

* * * * *